United States Patent
Miller et al.

(10) Patent No.: US 7,410,093 B2
(45) Date of Patent: Aug. 12, 2008

(54) SOLDER WAVE PROCESS FOR SOLDER SHUNTS FOR PRINTED CIRCUIT BOARD

(75) Inventors: Kevin L. Miller, Austin, TX (US); Thad C. McMillan, Austin, TX (US)

(73) Assignee: Dell Products L.P., Round Rock, TX (US)

(*) Notice: Subject to any disclaimer, the term of this patent is extended or adjusted under 35 U.S.C. 154(b) by 252 days.

(21) Appl. No.: 10/967,839

(22) Filed: Oct. 18, 2004

(65) Prior Publication Data

US 2005/0103828 A1  May 19, 2005

Related U.S. Application Data

(62) Division of application No. 10/449,251, filed on May 30, 2003, now abandoned.

(51) Int. Cl.
*B23K 31/02* (2006.01)
(52) U.S. Cl. .......................... 228/260; 228/37
(58) Field of Classification Search ................ 361/777, 361/760, 720, 748, 736; 174/261, 250, 256; 228/256, 260
See application file for complete search history.

(56) References Cited

U.S. PATENT DOCUMENTS

| 4,982,892 | A | * | 1/1991 | Parla et al. ............... 228/180.1 |
| 5,089,929 | A | | 2/1992 | Hilland ...................... 361/111 |
| 5,155,904 | A | * | 10/1992 | Majd ........................... 29/837 |
| 5,276,832 | A | | 1/1994 | Holman, Jr. ................. 395/425 |
| 5,308,928 | A | * | 5/1994 | Parla et al. .................. 174/261 |
| 5,788,855 | A | | 8/1998 | Landolf ....................... 216/13 |
| 6,045,032 | A | * | 4/2000 | Longgood et al. ...... 228/180.21 |
| 6,320,139 | B1 | * | 11/2001 | Byle et al. ................... 174/261 |
| 6,346,842 | B1 | | 2/2002 | Hall, Jr. et al. .............. 327/277 |
| 6,664,482 | B1 | | 12/2003 | Shaeffer et al. ............. 174/261 |

* cited by examiner

*Primary Examiner*—Kiley Stoner
(74) *Attorney, Agent, or Firm*—Baker Botts L.L.P.

(57) ABSTRACT

A method of making a printed circuit board having zero resistance connections. Pairs of shunt pads are formed on the board, spaced sufficiently far apart to avoid short circuiting but sufficiently close to permit a solder bridge to occur between them during a solder wave process.

7 Claims, 1 Drawing Sheet

SOLDER WAVE PROCESS FOR SOLDER SHUNTS FOR PRINTED CIRCUIT BOARD

RELATED APPLICATIONS

This application is a divisional of U.S. patent application Ser. No. 10/449,251 filed by Kevin L. Miller et al. on May 30, 2003, and entitled "Printed Circuit Board with Controlled Solder Shunts", now abandoned.

TECHNICAL FIELD OF THE INVENTION

This invention relates to printed circuit boards, and more particularly to using a solder wave process to form bridged solder pads for use as zero ohm resistors on a printed circuit board.

BACKGROUND OF THE INVENTION

A Printed Circuit Board (PCB) is a mechanical assembly consisting of layers of fiberglass sheet laminated with etched copper patterns. It is used to mount electronic parts, and the etched patterns provide interconnections between components. PCBs are also known as a Printed Wiring Boards (PWBs).

If an interconnection between two points is not printed onto the PCB, an interconnections between those points may also be achieved with a zero ohm resistor, also referred to as a jumper or crossover. Conventionally, zero ohm resistors have the same two-terminal form as non zero ohm resistors, and are mounted on the circuit board in the same manner.

SUMMARY OF THE INVENTION

An advantage of the invention is that it permits zero ohm resistors to be replaced with soldered shunts. The soldered shunts are formed by first printing shunt pads onto the board along with the other printed circuitry. Then, during the soldering process for mounting components, a bridge is formed across the shunt pads.

Thus, the shunt pads are formed during the manufacture of the board itself. The bridges across the shunts are formed during the normal soldering process. The "pick and place" steps required for zero ohm resistors are replaced with a simple soldering step. This eliminates the cost of the resistor components and reduces assembly time for the board.

The use of shunt pads makes it easy to accomplish hardware customization after a board is printed. If the shunt pads are in place, there are three choices for that location on the board: the shunt pads may be left as is for no interconnection, the shunt pads may be soldered for a zero ohm interconnection, or the shunt pads may be used as solder points for a non zero ohm resistor.

DETAILED DESCRIPTION OF THE INVENTION

Figure 1:
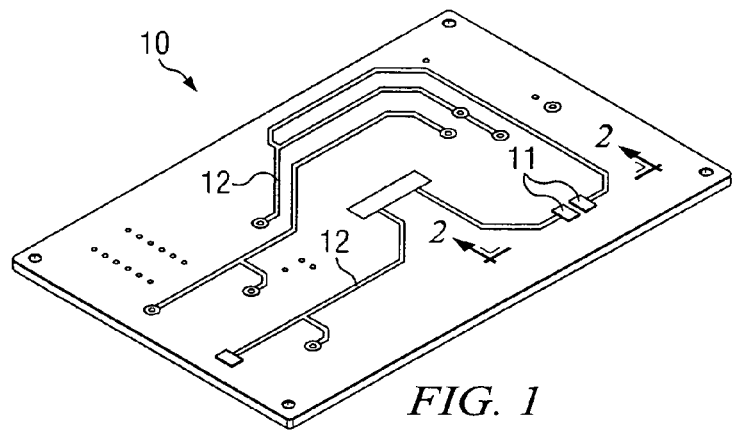
FIG. 1 illustrates a bare printed circuit board having a pair of shunt pads in accordance with the invention.

FIG. 1 is a top plan view of an example of a bare printed circuit board (PCB) 10 having a pair of zero resistor shunt pads 11 in accordance with the invention. As stated in the Background, PCB 10 comprises a base onto which conductive paths are printed. The conductive paths are made up of traces 12 that are etched onto the PCB, usually with copper.

In the example of FIG. 1, PCB 10 is a "surface mount" board, that is, its components are mounted on the PCB by soldering them directly to metal pads on its surface. The copper area to which a component part is soldered is sometimes called a "land pattern".

In contrast, for a "through-hole" PCB, holes are drilled through the PCB to permit component lead connections. Components are located on the top of the PCB (opposite the printed side) and their leads are placed through the holes to be soldered to pads on the bottom of the board.

Thus, for a surface mount board 10, the view of FIG. 1 is a top surface view. For a through-hole board, FIG. 1 would represent the bottom surface of the board. It is also increasingly common for PCBs to have both surface mount and through-hole components, such that etching (and shunt pads) may be on either or both sides of the PCB. In both FIG. 1 and FIG. 2, shunt pads 11 are larger than scale relative to PCB 10, for purposes of illustration, than would be typical in actual implementation.

For purposes of the present invention, shunt pads 11 could be used on either a surface mount or through hole board, or a board having both types of components, and could be placed on either side of the board. As explained below, in all cases, shunt pads 11 are used to create zero ohm resistors that interface to traces of the board.

Figure 2:
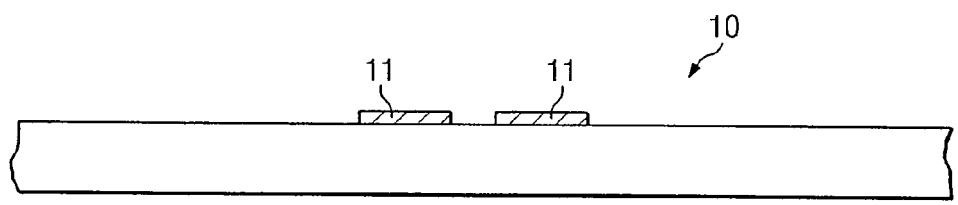
FIG. 2 is a cross sectional view of a pair of shunt pads.

FIG. 2 is a cross sectional view of a portion of PCB 10, showing two shunt pads 11. Only shunt pads 11 are shown in FIG. 2—board 10 will typically have other interconnections on the top of the board, including traces connecting the shunt pads to other circuitry on the board 10.

Pads 11 need only be as high as the traces and other printed circuitry on board 10. The distance between shunt pads 11 may be as far apart as is appropriate for traces, that is, sufficiently spaced apart so as to avoid short circuiting. On the other hand, the distance between shunt pads 11 is sufficiently close to permit a solder bridge to be made between them. The distance required between shunt pads 11 to encourage bridging will depend factors such as whether there is solder mask between them, the type of soldering process (solder paste or solder wave), and the shape of the pads 11, and the amount and characteristics of the solder.

Shunt pads 11 may be placed on a board anywhere a zero ohm resistor might be needed. Shunt pads 11 are designed into the board layout and printed on the board along with the rest of the board's metal patterning. Like other interconnections, such as traces and other pads, shunt pads are copper, formed by patterning and etching a blank board. Shunt pads 11 are exposed for soldering, that is, they are free of solder mask, as are other surfaces on board 10 that are to be soldered.

Figure 3:
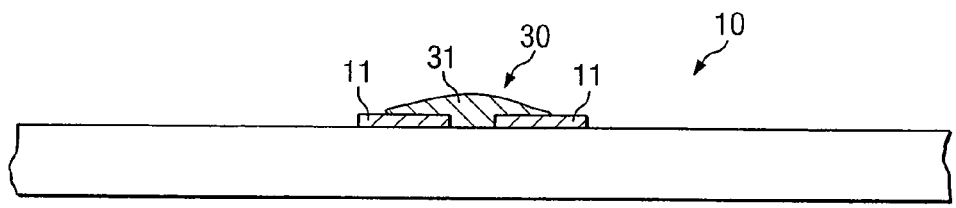
FIG. 3 illustrates the shunt pads of FIG. 2 with a solder bridge between them, forming a zero ohm interconnection.

FIG. 3 is a cross sectional view of the PCB portion of FIG. 2, with a conductive solder shunt 31 bridging the two shunt pads 11. That is, solder has been applied to pads 11 in a manner that forms a bridge between them. The solder adheres to the top surface of both shapes and forms bridge 31 across them. The solder bridge 11 need not contact or adhere to the surface of the board 10 so long as contact is made from one pad 11 to the other pad 11.

The solder shunt 31 is a "bridge" in the sense that it may be formed during an automated soldering process by means of the solder bridging from one pad 11 to the other 11. The intentional bridging of the present invention is in comparison to conventional soldering processes where the same "solder bridging" would be an undesired effect.

The solder shunt 31 may be created by conventional solder processes, including solder paste, solder wave, or hand soldering processes. A feature of the invention is that the soldering process used to form the solder bridge 31 is the normal "board soldering process", that is, the soldering process used to mount the board components. In other words, the bridge 31 need not be formed in a special soldering step.

In effect, pads 11 and bridge 31 become a zero ohm resistor 30. Rather than being printed or pick-and-placed, it is formed during the solder process by the solder itself. Thus, the zero ohm resistor 30 formed by pads 11 and bridge 31 is neither a trace interconnection nor a pick-and-place component, but rather a circuit board element formed during the solder process.

Referring again to FIG. 1, for a surface mount board, the solder mask may include the area between the shunt pads 11. The top surface of the shunt pads 11 is free of the solder mask so that solder may adhere to shunt pads 11 and form bridge 31 between them. This is in contrast to other soldering techniques, where effort is made to prevent pins or other features from becoming soldered together.

Figure 4:
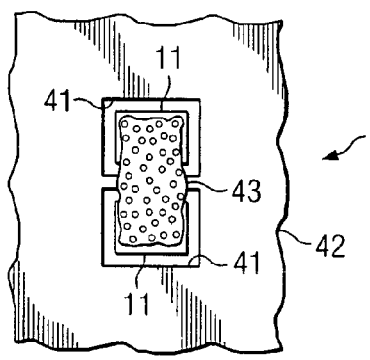
FIG. 4 illustrates how the bridge of FIG. 3 may be formed by means of solder paste.

FIG. 4 illustrates how bridge 31 may be formed using solder paste. FIG. 4 illustrates a portion of a board 40 after solder paste has been applied and prior to soldering.

A window in the solder mask 42 has been formed around each shunt pad 11. In the example of FIG. 4, there are two windows 41 in the solder mask 42 and there is solder mask material between the pads 11. In other embodiments, a single window in the mask 42 could open to both pads. As indicated above, the presence of solder mask between the pads 11 may be less encouraging of bridging between pads, but bridging may be otherwise encouraged by other factors. Here, solder paste 43 has been applied between shunt pads 11 as well as on them, so as to encourage bridging.

For creating bridge 31 by means of solder paste, the solder paste may be an alloy or pure metal which, when heated, liquefies and melts to flow onto the space between pads 11. Conventional solder paste is suitable for this purpose, and may consist of finely atomized filler metal alloy blended with flux and a paste-like binder. Solder paste delivers all the ingredients for a strong bridge in one deposit. Stored in a pressurized reservoir, the solder paste is dispensed automatically in premeasured amounts. Upon heating, the liquid flux is released first, removing and preventing reformulation of surface oxides. The powder filler metal then melts and flows onto shunt pads 11 and bridging the gap between them, cooling to form a reliable connection between shunt pads 11. The solder paste used to form bridge 31 can be stenciled, applied, and cooled during the same solder process used to mount surface mount components.

Figure 5:
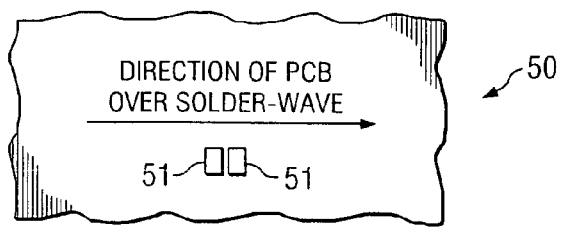
FIG. 5 is a top plan view of the shunt pad design for a solder wave process.

FIG. 5 illustrates how a solder shunt can also be formed as part of a solder wave, such as the solder wave process typically associated with soldering through-hole devices. As stated above, shunt pads 51 would be located on the "bottom" of the board 50, that is, the side of the board opposite the components. To form a through-hole board with a zero resistor, shunt pads 51 are printed together with other interconnections. Then, the various components are placed on the board. The solder wave is applied to the bottom of the board. During the solder wave process, shunt pads 51 are exposed such that solder adheres to them to form a bridge.

As illustrated in FIG. 5, the shapes of the two adjacent shunt pads 51 are not necessarily the same. For example, when the bridge is to be formed by a solder wave process, the leading pad (the one first presented to the solder wave) may be somewhat smaller. Nor are the shunt pads 51 necessarily rectangular.

Referring again to FIG. 1, and to the use of shunt pads 11 in general, experimentation may show that some shapes and sizes of shunt pads 11 better facilitate creation of bridge 31 than others, depending on factors such as the type of solder process or the type of solder.

If desired, shunt pads 11 can be designed such that they be either bridged to form zero ohm resistor 30 or used for a non zero ohm surface mount resistor. This provides a "dual footprint" design, which makes the board capable of having a resistor of any value at that location on the board. This provides three options at that location on the board: no interconnection, a zero ohm resistor 30, or a resistor component. For example, in the case of a surface mount board, shunt pads 11 would have a size and shape suitable for surface mounting a resistor component. For a through hole board, shunt pads 11 could be capable of having holes drilled for mounting a through-hole resistor. Also, if desired, the solder shunt can be accomplished in a manner that permits its easy removal if the zero ohm interconnection is no longer desired.

Shunt pads such as those of FIG. 1 can be configured for designs other than simple two terminal resistors. For example, a set of shunt pads could be configured to replace two-terminal devices integrated into a single package, such as a resistor pack. Or, a set of shunt pads cold be configured to replace multi-terminal elements, such as a star-routing connection.

What is claimed is:

1. A method of forming a zero resistance connection on a printed circuit board, the method comprising:
   printing metal circuitry on a circuit board base, the circuitry including a pair of shunt pads spaced sufficiently apart from each other so as to avoid short circuiting but sufficiently close together so as to result in solder bridging during a solder wave process; and
   soldering the circuit board base using a solder wave process to both:
      (a) mount one or more components to the circuit board base; and
      (b) form a solder bridge between the pair of shunt pads in the same solder wave process.

2. The method of claim 1, wherein the printed circuit board is a through hole board, and the solder wave process is applied to the bottom of the board.

3. The method of claim 1, wherein the printed circuit board has interconnections for both through hole and surface mount components.

4. The method of claim 1, wherein the soldering step is also used for soldering component interconnections on the bottom of the board.

5. The method of claim 1, wherein the shunt pads in each pair are sized relative to each other to promote bridging during the solder wave process.

6. The method of claim 5, wherein the leading shunt pad relative to the solder wave is smaller than the trailing shunt pad of each pair of shunt pads.

7. The method of claim 1, wherein at least one of the shunt pads of each pair of shunt pads is shaped to promote bridging during the solder wave process.

* * * * *